(12) United States Patent
Pawlik et al.

(10) Patent No.: US 8,828,152 B2
(45) Date of Patent: Sep. 9, 2014

(54) PASSIVATED METAL CORE SUBSTRATE AND PROCESS FOR PREPARING THE SAME

(75) Inventors: Michael J. Pawlik, Glenshaw, PA (US); Kelly L. Mardis, Farmington, PA (US); Robin M. Peffer, Valencia, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 606 days.

(21) Appl. No.: 12/183,384

(22) Filed: Jul. 31, 2008

(65) Prior Publication Data

US 2010/0028708 A1 Feb. 4, 2010

(51) Int. Cl.
*C23C 22/30* (2006.01)

(52) U.S. Cl.
USPC ............. 148/267; 148/264; 174/262; 216/17; 216/18; 216/19

(58) Field of Classification Search
USPC .......... 148/264–268; 174/262; 216/17, 18, 19
See application file for complete search history.

(56) References Cited

U.S. PATENT DOCUMENTS

| | | | | |
|---|---|---|---|---|
| 3,535,213 A | * | 10/1970 | Okada | 205/178 |
| 3,717,509 A | * | 2/1973 | Palm et al. | 148/265 |
| 4,082,620 A | * | 4/1978 | Skurkiss | 205/135 |
| 4,180,442 A | * | 12/1979 | Byrd | 205/50 |
| 4,224,400 A | * | 9/1980 | Koel et al. | 430/320 |
| 4,780,153 A | * | 10/1988 | Guhde et al. | 428/472.1 |
| 4,915,797 A | * | 4/1990 | Vigezzi et al. | 205/138 |
| 5,153,986 A | | 10/1992 | Brauer et al. | |
| 5,773,087 A | * | 6/1998 | Kashihara et al. | 427/292 |
| 5,821,174 A | | 10/1998 | Hong et al. | |
| 5,906,688 A | | 5/1999 | Ohmi | |
| 6,004,448 A | | 12/1999 | Martyak | |
| 6,407,341 B1 | | 6/2002 | Anstrom et al. | |
| 6,671,950 B2 | * | 1/2004 | Sturni et al. | 29/852 |
| 6,820,332 B2 | | 11/2004 | Japp et al. | |
| 2004/0003999 A1 | | 1/2004 | McCollum et al. | |

FOREIGN PATENT DOCUMENTS

GB 2162696 2/1986

OTHER PUBLICATIONS

U.S. Appl. No. 61/037,814, filed Mar. 19, 2008, Mardis et al.
IPC-TM-650 Test Methods Manual, The Institute for Interconnecting and Packaging Electronic Circuits, 2 pgs.

* cited by examiner

*Primary Examiner* — Lois Zheng
(74) *Attorney, Agent, or Firm* — Robert P. Lenart

(57) ABSTRACT

A substrate includes an iron-nickel alloy core or a cobalt-nickel ferrous alloy core, a chromium conversion coating on at least a portion of the core, and an insulating coating on the chromium conversion coating. A method of making a substrate includes: providing an iron-nickel alloy core or a cobalt-nickel ferrous alloy core, applying a chromium conversion coating on at least a portion of the core, and applying an insulating coating on the chromium conversion coating.

18 Claims, 1 Drawing Sheet

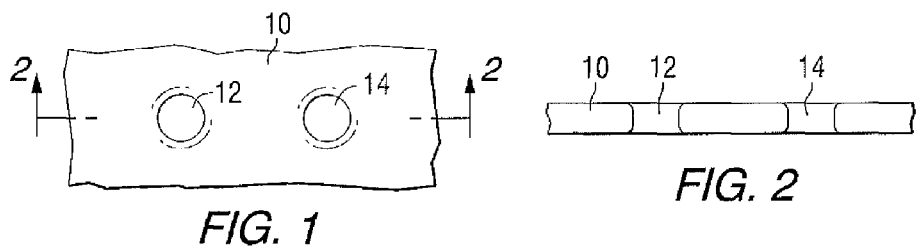
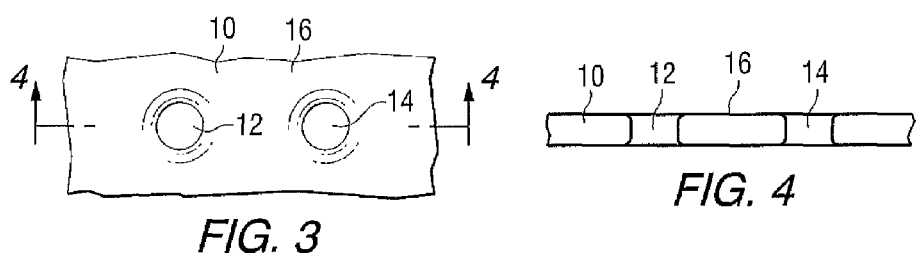
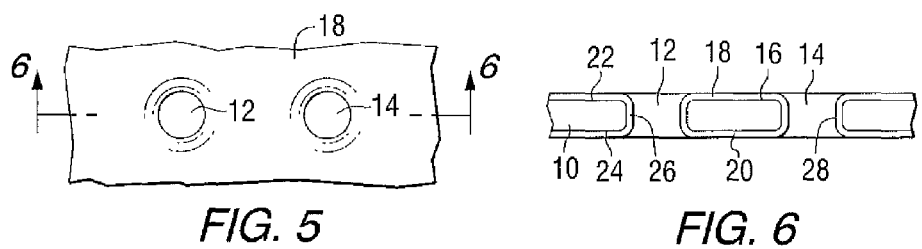
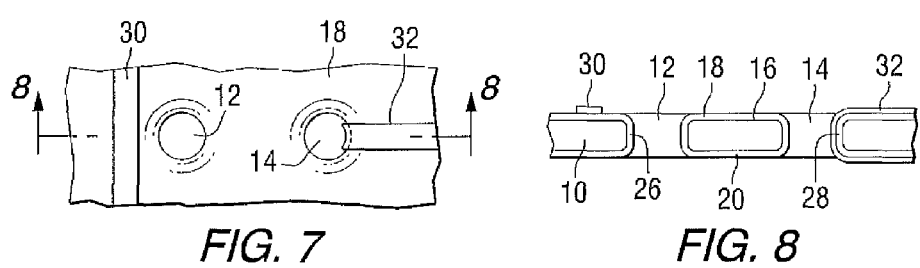

PASSIVATED METAL CORE SUBSTRATE AND PROCESS FOR PREPARING THE SAME

FIELD OF THE INVENTION

The present invention relates to electronic circuit assemblies, and more particularly, to circuit assemblies including metal core substrates, and the fabrication thereof.

BACKGROUND OF THE INVENTION

Microelectronic circuit packages are prepared in various sizes. One packaging level includes semiconductor chips containing multiple microcircuits and/or other components. Such chips are usually made from semiconductors such as silicon, and the like. Intermediate package levels (i.e., "chip carriers") comprising multi-layer substrates may include a plurality of chips. Likewise, these intermediate package levels can be attached to larger scale circuit cards, motherboards, and the like. The intermediate package levels serve several purposes in the overall circuit assembly including structural support, transitional integration of the smaller scale circuits to larger scale boards, and the dissipation of heat from the circuit components. Substrates used in conventional intermediate package levels have included a variety of materials, for example, ceramics, fiberglass reinforced polyepoxides, and polyimides.

In order for the aforementioned substrates to have sufficient rigidity, they usually have to be used at thicknesses exceeding 100 microns to provide structural support to the circuit assembly. Also, the aforementioned substrates typically have thermal coefficients of expansion much different from that of the microelectronic chips attached to them. As a result, failure of the circuit assembly after repeated use is a risk due to the failure of joints between the layers of the assembly.

It would be desirable to provide a thin circuit assembly with improved thermal and structural properties that overcome the drawbacks of the prior art.

SUMMARY OF THE INVENTION

In a first aspect, the invention provides a substrate comprising an iron-nickel alloy core, a chromium conversion coating on at least a portion of the core, and an insulating coating on the chromium conversion coating.

In another aspect, the invention provides a method of making a substrate comprising: providing an iron-nickel alloy core, applying a hexavalent or trivalent chromium conversion coating on at least a portion of the core, and applying an insulating coating on the chromium conversion coating.

BRIEF DESCRIPTION OF THE DRAWINGS

FIG. 1 is a plan view of a substrate core that may be used in one aspect of the invention.

FIG. 2 is a cross-sectional view of the substrate core of FIG. 1, taken along line 2-2.

FIG. 3 is a plan view of the substrate core of FIG. 1, with a passivation coating.

FIG. 4 is a cross-sectional view of the substrate core of FIG. 3, taken along line 4-4.

FIG. 5 is a plan view of the substrate of FIG. 3, with an insulating coating.

FIG. 6 is a cross-sectional view of the substrate of FIG. 5, taken along line 6-6.

FIG. 7 is a plan view of the substrate of FIG. 5 with conductive tracks on the insulating coating.

FIG. 8 is a cross-sectional view of the substrate of FIG. 7, taken along line 8-8.

DETAILED DESCRIPTION OF THE INVENTION

In a first aspect, this invention relates to substrates having a metal core that may be coated with an organic insulating material. Such substrates may be used in electronic circuit packages.

FIG. 1 is a plan view of a substrate core 10 that may be used in one aspect of the invention. FIG. 2 is a cross-sectional view of the substrate core of FIG. 1 taken along line 2-2. In this example, the core includes a generally planar sheet of metal alloy, which may or may not include holes or vias, such as 12 and 14.

In some embodiments, the substrate core can have a thickness of about 10 to 400 microns, or more specifically about 20 to 200 microns. In specific examples, the core can have a minimum thickness of about 10 microns, about 20 microns, or about 30 microns. The holes can have a uniform size and shape. When the holes are circular, the diameter of the holes can be as small as about 4 mil (101.6 microns). The holes may be larger or smaller as necessary, with the provision that the holes are large enough to accommodate all the layers applied in subsequent processing, without becoming obstructed.

In one example, the metal core can be an iron-nickel alloy, such as INVAR, (trademark owned by Imphy S. A., 168 Rue de Rivoli, Paris, France) comprising approximately 64 weight percent iron and 36 weight percent nickel. This alloy has a low coefficient of thermal expansion, comparable to that of the silicon materials used to fabricate electronic devices (e.g., chips). This property is desirable in order to prevent failure of adhesive joints between successively larger or smaller scale layers of a chip scale package, due to thermal cycling in storage or normal use.

In previously known substrates that included an INVAR core, a layer of copper metal has been applied to all surfaces of the INVAR core to provide increased conductivity. The layer of copper typically can have a thickness of from 1 to 20 microns. However, it would be desirable to have substrates having an INVAR core that do not include a copper coating.

With an uncoated INVAR core, undesirable chemical changes at the surface of the iron-nickel core can result in the formation of corrosion products. These chemical changes can be accelerated at elevated temperatures. For example, corrosion products may be formed on an iron-nickel alloy core within 24 hours under the Autoclave test conditions set forth in the IPC-TM-650 protocol, even when the corrosion products do not form under standard ambient pressure corrosion testing after 2 weeks. It would be desirable to minimize the formation of corrosion products on the iron-nickel core.

In another example, the core material is KOVAR (trademark of Carpenter Technology Corporation); an alloy of about 54% iron, 29% nickel, and 17% cobalt. KOVAR is a nickel-cobalt ferrous alloy designed to have a coefficient of thermal expansion that is compatible with other materials used in circuit assemblies.

In one aspect, this invention uses a chromium conversion treatment to passivate an iron-nickel alloy substrate, which is then coated with a coating of dielectric material. The chromium conversion treatment is utilized as a passivating agent for preventing corrosion which can occur under the high pressure/high temperature humid environments normally seen in autoclave testing.

FIG. 3 is a plan view of the substrate core of FIG. 1, with a passivation coating 16 applied to the surface of the core. FIG. 4 is a cross-sectional view of the substrate core of FIG. 3, taken along line 4-4.

In one aspect, this invention provides a method and apparatus using trivalent or hexavalent chromium as passivating agents for an INVAR or KOVAR core substrate, that can pass an adhesion peel test required by the IPC-TM-650 protocol. The IPC-TM-650 protocol specifies a 96 hour autoclave test.

Chromium conversion passivation treatments have been applied to INVAR and KOVAR metal cores in the following examples.

Example 1

Pretreatment of INVAR and KOVAR substrate cores in an Alodine process using the following steps.

1) Ridolene 298 Cleaner: 130° F.; 120 sec; immersion with agitation

2) Immersion Tap Rinse: ambient; 60 sec; with agitation

3) Spray tap rinse (water bottle)

4) DeOx 6/16 mixture: ambient; 150 sec; no agitation

5) Immersion Tap Rinse: ambient; 60 sec; with agitation

6) Spray tap water rinse (water bottle)

7a) Alodine 1000: ambient; 300 sec; no agitation

7b) Alodine 1200S: ambient; 150 sec; no agitation

7c) Alodine 1600: ambient; 300 sec; no agitation

8) Immersion DIW Rinse: ambient; 60 sec; with agitation

9) Final spray rinse DIW (water bottle)

Steps 7a), 7b) and 7c) are optional alternative steps. If used, only one of these steps is used in a particular example.

Example 2

Pretreatment of INVAR and KOVAR substrate cores in a Metalast using the following steps.

1) Metalast 1000 Cleaner: 120° F.; 120 sec; immersion with agitation

2) Immersion DIW Rinse: ambient; 60 sec; with agitation

3) Spray DIW rinse (water bottle)

4) DeOx LNC: ambient; 180 sec; no agitation

5) Immersion DIW Rinse: ambient; 60 sec; with agitation

6) Spray DIW rinse (water bottle)

7) Metalast TCP: ambient; 300 sec; no agitation

8) Immersion DIW Rinse: ambient; 60 sec; with agitation

9) Final spray rinse DIW (water bottle)

In Examples 1 and 2, all deoxidizers-pretreatments were applied at room temperature. The cleaner Ridolene 298 was applied via immersion at 130 F for 2 min, Ridolene 298 is available from Henkel Corporation. Metalast 1000 cleaner was applied via immersion at 120 F for 2 min. Metalast 1000 is available from Metalast International, Inc.

DeOx 6/16 is a deoxidizing treatment available from Henkel Corporation. DeOx 6/16 serves as an acid etch solution. The etch rate can be controlled by controlling the acid fluoride concentration and/or the time for which the acid etch is applied to the core. Table 1 shows examples of how an Invar core thickness can be controlled by controlling the time for which it is exposed to an acid etch solution.

TABLE 1

Deoxidizer Effect on Invar vs. Time

| Deox Time (min) | Invar Thickness (μm) |
|---|---|
| 0 | 60 |
| 2 | 53 |
| 3 | 51 |
| 4 | 44 |
| 5 | 41 |
| 7 | 30 |
| 10 | 18 |

DeOx LNC is an aqueous deoxidizer available from Oakite.

Both hexavalent Cr and trivalent Cr treatments can be used to passivate metal surfaces. The reaction mechanism is different, hexavalent Cr is reduced to trivalent Cr in an electrolytic reaction with the substrate (substrate is oxidized). Trivalent Cr treatments can deposit their Cr onto the surface via metathesis (exchange of anions with the metal surface). In both cases the final product may contain an insoluble Cr (III) oxide which acts as the passivating layer. In both cases the treatments are typically referred to as chromium conversion coatings.

Alodine 1000, 1200S and 1600 are chrome conversion treatments available from Henkel Corporation. Alodine 1000, 1200S and 1600 serve as passivation solutions. Metalast TCP-HF is an aqueous trivalent chromium pretreatment available from Metalast International, Inc.

FIG. 5 is a plan view of the substrate of FIG. 3, with an insulating coating applied to the passivating coating. FIG. 6 is a cross-sectional view of the substrate of FIG. 5, taken along line 6-6. First and second layers 18 and 20 of an insulating material are positioned on opposite sides (or surfaces) 22, 24 of the core. Additional insulation 26 and 28 can be deposited on the walls of the openings 14 and 16.

The following examples illustrate the preparation of an electrodeposition coating and its use in coating passivated portions of the substrate core.

Example I

The following example describes the synthesis of the cationic binder used in the electrodepositable coating bath described below. The binder was prepared from the following ingredients:

| Ingredients | Parts by Weight (in grams) |
|---|---|
| MAZON .RTM. 1651[1] | 150.0 |
| EPON .RTM. 880[2] | 755.3 |
| Tetrabromo bisphenol A | 694.9 |
| TETRONIC .RTM. 150R1[3] | 0.2857 |
| Aminopropyldiethanolamine | 114.7 |
| Diethanolamine | 49.57 |
| 2-Butoxyethanol | 382 |
| EPON 880 | 48.3 |
| Crosslinker[4] | 1195 |

[1] A plasticizer, commercially available from BASF Corporation.
[2] An epoxy resin available from Hexion Specialty Chemicals.
[3] A surfactant, commercially available from BASF Corporation.
[4] A polyester prepared according to Example V of EP 0 012 463, and diluted to 90% solids in 2-butoxyethanol.

The MAZON 1651, EPON 880, tetrabromo bisphenol A and TETRONIC 150R1 were charged to a 4-neck round bottom flask fitted with a stirrer, temperature probe, and Dean- Stark trap under a Nitrogen blanket. The mixture was heated to a temperature of 70° C. and stirred for 15 minutes. The heat source then was removed, and the aminopropyldiethanolamine and diethanolamine were added. The reaction mixture exothermed to a maximum temperature of 176° C. after about 10 minutes. The reaction was allowed to cool to a temperature of 135° C. over an hour, the 2-butoxyethanol was added, and the mixture was further cooled to 125° C. The mixture was then held at 125° C. for a total of two hours from the peak exotherm. The second charge of EPON 880 and the crosslinker were added and the solution was stirred for 2.5 hours at 125° C. The reaction mixture (3428 parts) was poured into a solution of sulfamic acid (49.5 parts) dissolved in deionized water (1287 parts) under strong agitation. After one hour agitation, an additional amount of deionized water (3970 parts) was added slowly, yielding a dispersion having a 30.2% non-volatile content.

Example II

This example shows the preparation of an ungelled cationic soap used in the synthesis of the microgel example shown below. The cationic soap was prepared from the following ingredients:

| Ingredients | Parts by Weight (in grams) |
| --- | --- |
| EPON 828 | 1023 |
| Bisphenol A-ethylene oxide adduct[1] | 365 |
| Bisphenol A | 297 |
| 2-Butoxyethanol | 187.2 |
| Benzyldimethylamine | 1.4 |
| Benzyldimethylamine | 3.0 |
| Diketimine[2] | 182.3 |
| N-methylethanolamine | 85.2 |
| Acetic Acid | 105.9 |
| Deionized water | 1065.9 |
| Deionized water | 735.9 |
| Deionized water | 1156.4 |
| Deionized water | 867.3 |

[1]A 1/6 molar adduct of bisphenol A/ethylene oxide available from BASF Surfactants.
[2]A 71 percent solution of the reaction product of diethylene triamine and methylisobutyl ketone in methylisobutyl ketone.

The EPON 828, bisphenol A-ethylene oxide adduct, bisphenol A and 2-butoxyethanol were charged into a reaction vessel and heated under a nitrogen atmosphere to a temperature of 125° C. The first portion of the benzyldimethylamine was added and the reaction was allowed to exotherm to 180° C. During the exotherm when the reaction reached 160° C., a one hour hold was begun. After the exotherm peak the resin was allowed to cool back to 160° C., continuing the hold. After the hold the reaction was cooled to 130° C., and the second portion of benzyldimethylamine was added. The reaction was held at 130° C. to an extrapolated epoxy equivalent weight of 1070. At the expected epoxy equivalent weight, the diketimine and N-methylethanolamine were added in succession and the mixture was allowed to exotherm to approximately 150° C. At the peak exotherm, a one hour hold was begun while allowing the reaction to cool to 125° C. After the one hour hold the resin was dispersed into a solution of the acetic acid dissolved in the first portion of deionized water. The dispersion was later reduced with the second, third, and fourth portions of deionized water. The resulting cationic soap was vacuum stripped until the methylisobutyl ketone level was less than 0.05%.

Example III

This example shows the synthesis of a cationic microgel from the cationic epoxy soap described above in Example II. The microgel was prepared from the following ingredients:

| Ingredients | Parts by Weight (in grams) |
| --- | --- |
| Cationic soap of Example II | 2517 |
| Deionized water | 443 |
| EPON 828 (85% in methylisobutyl ketone) | 66.4 |
| Methylisobutyl ketone | 5.81 |
| Deionized water | 337 |

The deionized water was added to the cationic soap of Example 2, and the mixture was heated to 70° C. under a nitrogen blanket. The EPON 828 solution was added over 15 minutes with good agitation. The methylisobutyl ketone was added as a rinse, and the mixture was held at 70° C. for 45 minutes. The mixture was then heated to 90° C. over 70 minutes and held at this temperature for 3 hours with good mixing. The deionized water was then added and the mixture was cooled yielding a microgel dispersion at 18.9% non-volatile content.

Electrodeposition Coating Bath and Coatings

Example A

This example shows the preparation of a blend used to prepare the coating bath described below in Example C. The blend was prepared from the following ingredients:

| Raw Material | Parts by Weight (in grams) |
| --- | --- |
| Cationic Epoxy High MW with polyester x-linker (Example 1) | 1023.7 |
| Ethylene Glycol Monohexyl Ether | 34.4 |
| Microgel (Example 3) | 344.3 |
| DI Water | 2037.6 |

The electrodeposition resin of Example 1 was placed in a container under slow agitation. The ethylene glycol monohexyl ether was added to this resin slowly under agitation and stirred for 30 minutes. The deionized water was then added to this mixture.

Example B

This example shows the preparation of a second blend used to prepare the coating bath described below in Example C. The blend was prepared by adding the following catalyst to the blend of Example A:

| Raw Material | Parts by Weight (in grams) |
| --- | --- |
| E6278[1] | 13.0 |

[1]Catalyst paste, available from PPG Industries, Inc.
The above ingredients were mixed under low agitation for 30 minutes.

Example C

The second blend of Example B was added to the blend of Example A under agitation. Approximately 1720 grams of permeate were removed from the coating bath via ultrafiltration, the permeate being replaced with deionized water. The final pH and conductivity of the ultrafiltered paint were 5.08 and 566 microsiemens respectively. The measured solids of the tank (1 hour at 110° C.) was 9.43%.

Example D

The electrodepositable coating composition of Example C can be electrophoretically applied to passivated substrate core from the electrodeposition bath at a temperature of 85° F. for 45 to 240 seconds at 1.0 amps/4"×6" square substrate depending on desired coating thickness. The coating voltages can be, for example 150, 200, or 250 volts. The coating can then be cured (e.g., for 30 minutes at 240° C.).

The substrate can be circuitized to provide conductors on the insulating material. FIG. 7 is a plan view of the substrate of FIG. 5 with conductive tracks 30, 32 on the insulating coating. FIG. 8 is a cross-sectional view of the substrate of FIG. 7, taken along line 8-8. The assembly is mechanically robust and provides for efficient removal of heat from the electronic devices that can be mounted on the substrate.

In another aspect, the invention encompasses a method of making an electronic circuit assembly. The method comprises: (a) providing an iron-nickel alloy core; (b) applying a chromium conversion layer to at least a portion of the iron-nickel alloy core; and (c) applying a dielectric coating to a first surface of the chromium conversion layer. In this example, a metal core is formed first, and then any necessary pretreatments, dielectric coating application, sputtering, plating patterning, etc. are subsequently applied.

The dielectric coating can be applied to the exposed surfaces of the core to form a conformal coating thereon. As used herein, a "conformal" film or coating refers to a film or coating having a substantially uniform thickness, which conforms to the core topography, including the surfaces within (but, preferably, not occluding) holes in the core. The dielectric coating film thickness can be, for example, between 5 and 50 microns. A lower film thickness is desirable for a variety of reasons. For example, a dielectric coating having a low film thickness allows for smaller scale circuitry.

In another aspect, the invention provides a substrate including an iron-nickel alloy core having a plurality of holes or vias, a chromium conversion layer to at least a portion of the iron-nickel alloy core, and the holes or vias, and a dielectric coating on at least a portion of the chromium conversion layer and sidewalls of the holes or vias. In some embodiments, the core can have a thickness of about 10 to 400 microns, or more specifically about 20 to 200 microns. In specific examples, the core can have a minimum thickness of about 10 microns, about 20 microns, or about 30 microns. The core thickness can be controlled by controlling the acid fluoride concentration and/or the time for which the acid etch is applied to the core, as described above. In some examples, the ratio of the diameter of the holes to the thickness of the core can be about 2.5:1 or about 3:1. The use of thin cores allows the use of small holes having sidewalls that can be conformally coated with the described insulation coatings without plugging. For example, a 20 micron core can include holes as small as about 50 microns, or about 70 microns. In another example, a 30 micron core can include holes as small as about 90 microns, or about 100 microns.

The conductors or contacts can be formed by chemical, mechanical or laser ablating or using masking technologies to prevent coating application at selected areas or otherwise removing portions of the dielectric coating in a predetermined pattern to expose sections of the electrically conductive core, and applying a layer of metal to portions of the dielectric coating to form conductors and contacts. Metallization of the dielectric coating layers can also be used to form contacts and conductors adjacent to the surface of the dielectric coating layers.

It should be understood that any of the processes of the present invention can include one or more additional steps without departing from the scope of the inventor. Likewise, the order in which the steps are performed may be changed as necessary, without departing from the scope of the invention.

Structures fabricated in accordance with the above examples passed testing required by the IPC-TM-650 protocol. The test samples included the core, passivating coating, and dielectric coating.

Other than in the operating examples, or where otherwise indicated, all numbers expressing quantities of ingredients, reaction conditions and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical values, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between and including the recited minimum value of 1 and the recited maximum value of 10, that is, having a minimum value equal to or greater than 1 and a maximum value of equal to or less than 10.

Whereas particular embodiments of this invention have been described above for purposes of illustration, it will be evident to those skilled in the art that numerous variations of the details of the present invention may be made without departing from the invention as defined in the appended claims.

As used in this description, unless indicated to the contrary, the numerical parameters are approximations that may vary depending upon the desired properties sought to be obtained by the present invention. Thus each numerical parameter should at least be construed in light of the number of reported significant digits and by applying ordinary rounding techniques, or by taking typically manufacturing tolerances into account.

While the invention has been described in terms of several examples, it will be apparent to those skilled in the art that various changes can be made to the described examples without departing from the scope of the invention as set forth in the following claims.

What is claimed is:

1. A method of making a substrate for an electronic device package comprising:
   providing an iron-nickel alloy core or a cobalt-nickel ferrous alloy core;
   applying a chromium conversion coating on at least a portion of the core by applying an acid etch solution comprising a combination of an acid fluoride with chromic acid to etch the core and applying a passivation solution to the etched core; and applying a dielectric insulating coating on the chromium conversion coating, wherein the core includes a plurality of holes having diameters as low as 50 microns and the insulating coating conformally coats sidewalls of the holes, and wherein the ratio of the diameter of the holes to the thickness of the core is in the range of from 2.5:1 to about 3:1.

2. The method of claim 1, wherein the insulating coating is applied to the chromium conversion coating using electrodeposition.

3. The method of claim 1, wherein the passivation solution comprises an aqueous $Cr^{6+}$ and/or $Cr^{3+}$ solution.

4. The method of claim 3, wherein the etch rate is controlled by controlling acid etch solution concentration and/or time.

5. The method of claim 1, wherein the core is etched to a thickness of at least 30 microns.

6. The method of claim 1, wherein the core is etched to a thickness of 20 microns or less.

7. The method of claim 1, wherein the core is etched to a thickness of 10 microns or less.

8. The method of claim 1, wherein the substrate passes testing in an IPC-TM-650 protocol.

9. The method of claim 1, wherein the etch solution comprises DeOx 6/16.

10. A method of making a substrate for an electronic device package comprising:

providing an iron-nickel alloy core or a cobalt-nickel ferrous alloy Core;

applying an acid etch solution comprising a combination of an acid fluoride with chromic acid to etch the core;

applying a chromium conversion treatment to at least a portion of the core to form an insoluble Cr (III) oxide passivating layer on the portion of the core; and applying a dielectric insulating coating on the passivating layer.

11. The method of claim 10, wherein the insulating coating is applied to the passivating layer using electrodeposition.

12. The method of claim 10, wherein the chromium conversion treatment comprises an aqueous $Cr^{3+}$ solution.

13. The method of claim 10, wherein the etch rate is controlled by controlling acid etch solution concentration and/or time.

14. The method of claim 10, wherein the core is etched to a thickness of 20 microns or less.

15. The method of claim 10, wherein the core includes a plurality of holes having diameters as low as about 50 microns and the insulating coating conformally coats sidewalls of the holes.

16. The method of claim 15, wherein the ratio of the diameter of the holes to the thickness of the core is in the range of from 2.5:1 to 3:1.

17. The method of claim 10, wherein the substrate passes testing in an IPC-TM-650 protocol.

18. The method of claim 10, wherein the etch solution comprises DeOx 6/16.

* * * * *